United States Patent
Kubo et al.

(10) Patent No.: US 8,039,735 B2
(45) Date of Patent: Oct. 18, 2011

(54) LAMINATED FILM FOR DYE-SENSITIZED SOLAR CELL AND ELECTRODE FOR DYE-SENSITIZED SOLAR CELL, AND PROCESS FOR THEIR PRODUCTION

(75) Inventors: Koji Kubo, Gifu (JP); Chiharu Hirose, Oita (JP)

(73) Assignee: Teijin Dupont Films Japan Limited, Tokyo (JP)

( * ) Notice: Subject to any disclaimer, the term of this patent is extended or adjusted under 35 U.S.C. 154(b) by 1069 days.

(21) Appl. No.: 10/587,163

(22) PCT Filed: Jan. 28, 2005

(86) PCT No.: PCT/JP2005/001641
§ 371 (c)(1),
(2), (4) Date: Jul. 26, 2006

(87) PCT Pub. No.: WO2005/074068
PCT Pub. Date: Aug. 11, 2005

(65) Prior Publication Data
US 2007/0160940 A1    Jul. 12, 2007

(30) Foreign Application Priority Data

Jan. 30, 2004 (JP) ................................. 2004-022840
Mar. 3, 2004 (JP) ................................. 2004-058734
May 28, 2004 (JP) ................................. 2004-158976

(51) Int. Cl.
H01L 31/00 (2006.01)
(52) U.S. Cl. ....................................... 136/256; 136/252
(58) Field of Classification Search .................... 136/256
See application file for complete search history.

(56) References Cited

U.S. PATENT DOCUMENTS

| 6,291,763 B1 * | 9/2001 | Nakamura .................... 136/256 |
| 6,629,833 B1 * | 10/2003 | Ohya et al. .................... 425/458 |
| 2001/0029274 A1 * | 10/2001 | Murschall et al. ............. 524/93 |
| 2002/0037399 A1 * | 3/2002 | Tamai et al. ................... 428/328 |
| 2003/0051751 A1 | 3/2003 | Yamada et al. |
| 2003/0192584 A1 | 10/2003 | Beckenbaugh et al. |
| 2005/0238550 A1 * | 10/2005 | Granqvist et al. ......... 422/186.3 |

FOREIGN PATENT DOCUMENTS

| EP | 1 808 928 A1 | 7/2007 |
| JP | 57-057628 A | 4/1982 |
| JP | 1-259184 A | 10/1989 |
| JP | 1-275031 A | 11/1989 |
| JP | 6-207036 | 7/1994 |
| JP | 8-148036 A | 6/1996 |
| JP | 11-288745 A | 10/1999 |
| JP | 2000-031509 A | 1/2000 |
| JP | 2002-050413 A | 2/2002 |
| JP | 2002050413 A * | 2/2002 |
| JP | 2002-145615 A | 5/2002 |
| JP | 2003-297443 A | 10/2003 |
| JP | 2003-308890 A | 10/2003 |
| JP | 2004-009362 A | 1/2004 |
| JP | 2004-265662 A | 9/2004 |
| JP | 2005-056627 A | 3/2005 |

OTHER PUBLICATIONS

Machine translation of Abe et al. (JP 2002050413, published Feb. 15, 2002, accessed Aug. 6, 2009).*
EP Communication, dated Jun. 5, 2009, issued in corresponding EP Application No. 05704401.8, 3 pages.

* cited by examiner

*Primary Examiner* — Alexa Neckel
*Assistant Examiner* — Shannon Gardner
(74) *Attorney, Agent, or Firm* — Sughrue Mion, PLLC

(57) ABSTRACT

There is provided a laminated film for a dye-sensitized solar cell characterized by comprising a polyester film and a transparent conductive layer formed on one side thereof, the transparent conductive layer having a surface tension of 40 mN/m or greater, and an electrode for a dye-sensitized solar cell with excellent adhesion between the transparent conductive layer and porous semiconductor layer and high photogenerating efficiency.

8 Claims, No Drawings

LAMINATED FILM FOR DYE-SENSITIZED SOLAR CELL AND ELECTRODE FOR DYE-SENSITIZED SOLAR CELL, AND PROCESS FOR THEIR PRODUCTION

TECHNICAL FIELD

The present invention relates to a laminated film for a dye-sensitized solar cell, to an electrode for a dye-sensitized solar cell, and to a process for their production.

BACKGROUND ART

Since the initial report of photogenerating transforming elements using dye-sensitized semiconductor fine particles (Nature), Vol. 35, 737-740 (1991), dye-sensitized solar cells have been the object of interest as new solar cells to serve as potential alternatives for silicon-based solar cells. In particular, dye-sensitized solar cells employing plastic films as supports can be produced more flexibly and with lighter weights, and they have therefore been extensively studied.

DISCLOSURE OF THE INVENTION

With dye-sensitized solar cells employing plastic films as supports, the difficulty of forming porous semiconductor layers on transparent conductive layers hampers efforts to ensure satisfactory adhesion between the transparent conductive layers and porous semiconductor layers. The lack of guaranteed sufficient adhesion leads to reduced photogenerating performance of the solar cell.

It is an object of the present invention to provide a laminated film for a dye-sensitized solar cell and an electrode for a dye-sensitized solar cell which have excellent adhesion between the transparent conductive layer and the porous semiconductor layer, and allow formation of dye-sensitized solar cells with high photogenerating performance.

The present invention further provides a process for production of an electrode for a dye-sensitized solar cell which has excellent adhesion between the transparent conductive layer and the porous semiconductor layer.

Specifically, the invention provides a laminated film for a dye-sensitized solar cell characterized by comprising a polyester film and a transparent conductive layer formed on one side thereof, the transparent conductive layer having a surface tension of 40 mN/m or greater.

The invention also provides an electrode for a dye-sensitized solar cell comprising the aforementioned laminated film for a dye-sensitized solar cell and a porous semiconductor layer formed on its transparent conductive layer.

The invention further provides a process for production of an electrode for a dye-sensitized solar cell, characterized by forming a transparent conductive layer on one side of a polyester film having an absolute value of no greater than 0.8% for the difference in the heat shrinkage rates in the lengthwise direction and widthwise direction of the film upon treatment for 10 minutes at 200° C., and baking a metal oxide thereover at 170-250° C. to form a porous semiconductor layer.

The present invention will now be explained in greater detail.

<Polyester Film>
<Polyester>

According to the invention, the polyester of the polyester film is a linear saturated polyester synthesized from an aromatic dibasic acid or its ester-forming derivative and a diol or its ester-forming derivative.

Specific examples of such polyesters include polyethylene terephthalate, polyethylene isophthalate, polyethylene isophthalate, polybutylene terephthalate, poly(1,4-cyclohexylenedimethylene terephthalate) and polyethylene-2,6-naphthalate. Among these, polyethylene terephthalate and polyethylene-2,6-naphthalate are preferred for a satisfactory balance between dynamic properties and optical properties. In particular, polyethylene-2,6-naphthalate is most preferred because of its high mechanical strength, low heat shrinkage and low oligomer generation during heating.

The polyester may be a homopolymer or copolymer, although a homopolymer is preferred. When the polyester is a copolymer, the copolymerizing component is preferably used at no greater than 3 mole percent with respect to the total dicarboxylic acid component or total diol component.

When using a copolymerizing component, the dicarboxylic component may be an aromatic dicarboxylic acid such as phthalic acid or 2,6-naphthalenedicarboxylic acid, or an aliphatic dicarboxylic acid such as adipic acid, azelaic acid, sebacic acid or 1,10-decanedicarboxylic acid. Examples of diol components include aliphatic diols such as 1,4-butanediol, 1,6-hexanediol and neopentyl glycol, and alicyclic diols such as 1,4-cyclohexanedimethanol.

The polyester may be produced by a publicly known process. For example, it may be produced by a process in which the dicarboxylic acid and diol are reacted to directly obtain a low polymerization degree polyester. Alternatively, it may be produced by a process in which a lower alkyl ester of the dicarboxylic acid and the diol are subjected to ester-exchange reaction with an ester-exchange catalyst, and then polymerization reaction is conducted in the presence of a polymerization catalyst to obtain a polyester. Examples of ester-exchange catalysts that may be used include sodium, potassium, magnesium, calcium, zinc, strontium, titanium, zirconium, manganese and cobalt. Examples of polymerization catalysts that may be used include antimony trioxide, antimony pentaoxide, germanium dioxide, tetraethyl titanate, tetrapropyl titanate, tetraphenyl titanate, ammonium titanyloxalate, potassium titanyloxalate and titanium trisacetylacetonate.

When ester-exchange reaction is followed by polymerization reaction, a phosphorus compound is preferably added to inactivate the ester-exchange catalyst before polymerization. Examples of phosphorus compounds that may be used include trimethyl phosphate, triethyl phosphate, tri-n-butyl phosphate and orthophosphoric acid.

The intrinsic viscosity of the polyester is preferably 0.40 dl/g or greater and more preferably 0.40-0.90 dl/g. A viscosity of less than 0.40 dl/g may result in numerous process interruptions, while a viscosity of greater than 0.9 dl/g will hamper melt extrusion and lengthen the polymerization time, which is economically undesirable.

Preferably, the polyester film of the invention contains substantially no particles. The presence of particles may impair high transparency, roughen the surface and hamper working of the transparent conductive layer.

<Ultraviolet Absorber>

The polyester film of the invention preferably contains an ultraviolet absorber. Preferred ultraviolet absorbers for use are compounds represented by the following formula (I).

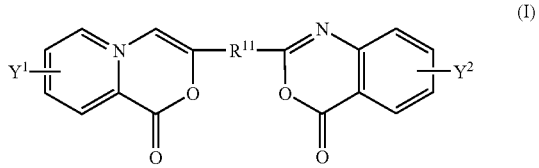

(wherein $R^{11}$ is a divalent aromatic hydrocarbon residue, and $Y^1$ and $Y^2$ each represent C1-10 alkyl, C1-3 alkoxy, a halogen or C2-4 acyl).

Preferred ultraviolet absorbers among the compounds represented by formula (I) are 2,2'-p-phenylenebis(3,1-benzooxazin-4-one), 2,2'-p-phenylenebis(6-methyl-3,1-benzooxazin-4-one), 2,2'-p-phenylenebis(6-chloro-3,1-benzooxazin-4-one), 2,2'-(4,4'-di-phenylene)bis(3,1-benzooxazin-4-one) and 2,2'-(2,6-naphthylene)bis(3,1-benzooxazin-4-one).

The ultraviolet absorber content is preferably 0.1-5 wt % and more preferably 0.2-3 wt % with respect to 100 wt % of the polyester in the polyester film. If the content is less than 0.1% it will not be possible to adequately lower the light transmittance at a wavelength of 370 nm, and if it is greater than 5 wt % the light transmittance at a wavelength of 400 nm will not be adequately increased.

The ultraviolet absorber may be added to the polyester film by, for example, a method of addition during polymerization of the polyester, a method of kneading with the polyester polymer during the melting step before film formation, or a method of impregnation into the film. Preferred among these is a method of kneading with the polyester polymer during the melting step before film formation. This method can prevent reduction in the polymerization degree of the polyester. Kneading of the ultraviolet absorber into the polyester polymer may be accomplished, for example, by a compound powder direct addition method or master batch method.

<Optical Properties>

The polyester film of the invention has a light transmittance of no greater than 3% and more preferably no greater than 2% at a wavelength of 370 nm, and a light transmittance of at least 70% and preferably at least 75% at a wavelength of 400 nm. If the light transmittance at a wavelength of 370 nm is greater than 3% the ultraviolet blocking effect will be insufficient, resulting in reduced photogenerating efficiency with time after fabrication of the dye-sensitized solar cell. If the light transmittance at a wavelength of 400 nm is less than 70% the amount of visible light contributing to photogeneration will be reduced, thereby leading to unsatisfactory photogenerating efficiency.

The haze of the polyester film of the invention is preferably no greater than 1.5%, more preferably no greater than 1.0% and even more preferably no greater than 0.5% for more efficient photogeneration.

<Heat Shrinkage Rate>

The polyester film of the invention has an absolute value of preferably no greater than 0.8%, more preferably no greater than 0.5% and even more preferably no greater than 0.3% for the difference in the heat shrinkage rates in the lengthwise direction and widthwise direction of the film upon treatment for 10 minutes at 200° C. If the absolute value of the difference in heat shrinkage rates is greater than 0.8%, cohesion between the transparent conductive layer of the laminated film and the porous semiconductor thereover will be impaired, making it difficult to achieve adequate photogenerating performance when fabricating a dye-sensitized solar cell.

The polyester film of the invention has a heat shrinkage of preferably 0-0.5% and more preferably 0-0.3% in the lengthwise direction of the film upon treatment for 10 minutes at 200° C. If the heat shrinkage in the lengthwise direction exceeds 0.5%, cohesion between the polyester film and transparent conductive layer of the laminated film will be reduced, while cohesion between the transparent conductive layer and the porous semiconductor layer thereover will also be reduced.

<Surface Roughness and Thickness>

The three-dimensional center line average roughness of the polyester film of the invention is preferably 0.0001-0.02 µm, more preferably 0.0001-0.015 µm and most preferably 0.0001-0.010 µm on both sides. Also, the three-dimensional center line average roughness is preferably 0.0001-0.005 µm and more preferably 0.0005-0.004 µm on at least one side. The thickness of the polyester film is preferably 10-500 µm, more preferably 20-400 µm and even more preferably 50-300 µm. This range is preferred to facilitate working of the transparent conductive layer.

<Polyester Film Production Process>

The polyester film having the properties described above may be produced by the following process, for example. Hereunder, "glass transition temperature" is abbreviated as "Tg".

The polyester film of the invention may be obtained by melt extruding the polyester into a film, cooling it to solidification on a casting drum to produce an unstretched film, stretching the unstretched film one or more times in the lengthwise direction at Tg–(Tg+60)° C. to a total factor of 3-6 and then stretching it in the widthwise direction at Tg–(Tg+60)° C. to a factor of 3-5, if necessary with heat treatment at 180-255° C. for 1-60 seconds.

In order to adequately reduce the difference in heat shrinkage rates in the lengthwise and widthwise directions of the polyester film, as well as the heat shrinkage in the lengthwise direction, the film may be contracted in the lengthwise direction in the heat treatment step, or it may be subjected to relaxation heat treatment in a suspended state. The method used for contraction in the lengthwise direction in the heat treatment step may be the method described in Japanese Unexamined Patent Publication HEI No. 57-57628. The method of relaxation heat treatment of the film in a suspended state may be the method described in Japanese Unexamined Patent Publication HEI No. 1-275031.

<Transparent Conductive Layer>

The transparent conductive layer used may be a conductive metal oxide such as, for example, fluorine-doped tin oxide or indium-tin oxide (ITO). There may also be used a metal thin-film made of, for example, platinum, gold, silver, copper or aluminum. A carbonaceous material may also be used.

The transparent conductive layer used may be of a single type, or two or more different ones may be laminated for use as a composite. Indium-tin oxide (ITO) is preferred among these materials because of its high light transmittance and low resistance.

The surface tension of the transparent conductive layer is 40 mN/m or greater and preferably 65 mN/m or greater. If the surface tension is less than 40 mN/m, cohesion between the transparent conductive layer and porous semiconductor will be inferior. The surface tension is preferably 65 mN/m or greater for easier formation of the porous semiconductor layer by coating of an aqueous coating solution. The practical upper limit for the surface tension of the transparent conductive layer is about 75 mN/m in order to facilitate coating of a completely aqueous coating agent.

The range for the surface resistance of the transparent conductive layer is preferably no greater than 100Ω/□ and more preferably no greater than 40Ω/□. It is preferably not greater than 100Ω/□ because the internal resistance of the cell will be excessively increased and the photogenerating efficiency will be reduced.

The thickness of the transparent conductive layer is preferably 100-500 nm. It is preferably not less than 100 nm because it will not be possible to adequately reduce the surface resistance value, and preferably not greater than 500 nm because the light transmittance will be reduced and the transparent conductive layer will be prone to cracking.

The surface tension may be determined by activation of the surface of the transparent conductive layer by any of the methods described below. Specifically, there may be mentioned a method of activation by treatment with an acidic or alkaline solution, a method of activation by irradiation with ultraviolet rays or an electron beam, and a method of activation by corona treatment or plasma treatment. Of these, methods of activation of the surface by corona treatment or plasma treatment, and especially methods of activation of the surface by plasma treatment, are preferred to obtain high surface tension. When the transparent conductive layer surface is activated by plasma treatment, it may be conducted under the following conditions, for example. Specifically, a normal pressure plasma surface treatment apparatus may be used for plasma treatment of the transparent conductive layer surface at 0.1-10 m/min under a 1-200 L/min stream of an inert gas or a mixture of an inert gas and oxygen. Nitrogen, for example, may be used as the inert gas.

<Easily Bonding Layer>

In the laminated film of the invention, a readily adhesive layer is preferably provided between the polyester film and the transparent conductive layer in order to improve the cohesion between the polyester film and the transparent conductive layer formed thereover. The thickness of the readily adhesive layer is preferably 10-200 nm and more preferably 20-150 nm. If the thickness of the readily adhesive layer is less than 10 nm the effect of improved cohesion will be minimal, and if it is greater than 200 nm the readily adhesive layer will be prone to clumping and breakage, resulting in reduced cohesion.

The readily adhesive layer is preferably formed by coating in the polyester film production step. The coating is preferably carried out on the polyester film prior to completion of oriented crystallization. The expression "polyester film prior to completion of oriented crystallization" includes unstretched films, uniaxial stretched films that have been oriented in either the machine or transverse direction of an unstretched film, and biaxial stretched films that have been stretched to a low factor in both the machine and transverse directions (biaxial stretched films prior to completion of oriented crystallization by final re-stretching in the machine or transverse direction). Preferably, an aqueous coating solution having the composition of the readily adhesive layer is coated onto an unstretched film or a uniaxial stretched film, and this is subjected to longitudinal and/or transverse stretching to obtain a biaxial stretched film, which is then heat set.

The readily adhesive layer is preferably composed of a material that exhibits excellent adhesion for both the polyester film and the transparent conductive layer. Specific examples of such materials include polyester resins, acrylic resins, urethane-acrylic resins, silicon-acrylic resins, melamine resins and polysiloxane resins. These resins may be used alone, or two or more may be used in admixture.

<Hard Coat Layer>

In the laminated film of the invention, a hard coat layer is preferably provided between the readily adhesive layer and the transparent conductive layer in order to improve the cohesion, and especially the durability of cohesion, between the polyester film and the transparent conductive layer formed thereover. The hard coat layer may be formed by coating and hardening a hard coat structural material on the readily adhesive layer-formed polyester film. As hard coat layer structural materials there may be used ones which exhibit adhesion with both the readily adhesive layer and the transparent conductive layer. For example, a mixture of a resin and inorganic particles may be used. Examples of resins that may be used include acrylic resins, urethane resins, silicon resins, UV curing resins and epoxy resins. Examples of inorganic particles that may be used include alumina, silica and mica. The thickness of the hard coat layer is preferably 0.01-20 μm and more preferably 1-10 μm.

<Anti-reflection Layer>

The laminated film of the invention preferably comprises an anti-reflection layer on the side opposite the transparent conductive layer, in order to increase the light transmittance and enhance the photogenerating efficiency.

The anti-reflection layer may be provided by forming a single layer or a multilayer of a material with a different refractive index than the refractive index of the polyester film. In the case of a single anti-reflection layer, a material having a smaller refractive index than the base film may be used. In the case of multiple anti-reflection layers, preferably a material having a larger refractive index N than the polyester film is selected as the material for the layer adjacent to the laminated film, and a material having a refractive index N' smaller than N is selected as the material for the layer laminated thereover.

The material composing the anti-reflection layer may be an organic material and/or inorganic material satisfying the aforementioned relationship for the refractive index. As examples there may be mentioned dielectric materials such as $CaF_2$, $MgF_2$, $NaAlF_4$, $SiO_2$, $ThF_4$, $ZrO_2$, $Nd_2O_3$, $SnO_2$, $TiO_2$, CeO2, ZnS and $In_2O_3$.

The method for laminating the anti-reflection layer may be for example, a dry coating method or wet coating method. As examples of dry coating methods there may be mentioned vacuum vapor deposition, sputtering, CVD and ion plating. As examples of wet coating methods there may be mentioned gravure, reverse and die coating.

Before laminating the anti-reflection layer, the side on which the anti-reflection layer is to be formed may be subjected to pretreatment such as corona discharge treatment, plasma treatment, sputter-etching treatment, electron beam irradiation treatment, ultraviolet irradiation treatment, primer treatment or ready adhesion treatment.

<Porous Semiconductor Layer>

The electrode for a dye-sensitized solar cell of the invention comprises a laminated film for the dye-sensitized solar cell and a porous semiconductor layer formed on its transparent conductive layer. The porous semiconductor layer is formed by baking a metal oxide on the transparent conductive layer at 170-250° C. The metal oxide forms the porous semiconductor layer as an n-type semiconductor. A material comprising a composite of multiple oxides may also be used.

According to the invention, the porous semiconductor layer is formed by baking the metal oxide on the transparent conductive layer formed on one side of the polyester film, at 170-250° C. The polyester film used is preferably a polyester film having an absolute value of no greater than 0.8% for the difference in the heat shrinkage rates in the lengthwise direction and widthwise direction of the film upon treatment for 10 minutes at 200° C.

The metal oxide is preferably at least one type of metal oxide selected from the group consisting of titanium oxide ($TiO_2$), zinc oxide (ZnO) and tin oxide ($SnO_2$).

The baking is carried out for reinforcement of electrical contact between the semiconductor fine particles and improved adhesion with the transparent conductive layer. The baking conditions are preferably 170-250° C. for 1-120 minutes, more preferably 180-230° C. for 3-90 minutes and most preferably 190-200° C. for 5-60 minutes. The baking can minimize increase in resistance of the porous semiconductor layer while preventing heat-induced deformation of the polyester film. If the baking temperature is below 170° C., it will not be possible to adequately reinforce electrical contact between the semiconductor fine particles, and the photogenerating efficiency of the fabricated dye-sensitized solar cell will be reduced. If the temperature is above 250° C., heat-induced deformation of the polyester film will be significant and cohesion between the transparent conductive layer and porous semiconductor layer will be reduced.

The porous semiconductor layer has a structure with sintered or fused semiconductor ultrafine particles. The particle sizes of the ultrafine particles are preferably 5-100 nm and more preferably 5-50 nm, as the mean primary particle size.

The semiconductor ultrafine particles may also be a mixture of two or more types of fine particles with different particle size distributions. Semiconductor particles with large particle sizes may also be combined therewith in order to scatter incident rays and improve the optical trapping efficiency. Such semiconductor particles may have a mean primary particle size of about 300 nm, for example.

Semiconductor ultrafine particles for the porous semiconductor layer may be prepared by a publicly known sol-gel method or gas-phase thermal decomposition method (see "Dye-Sensitized Solar Cells, Fundamentals and Applications", Yanagida, S. ed., 2001, Gijutsu Kyoiku Publications, or "Thin-Film Coating Technology by Sol-Gel Methods", 1995, Gijutsu Kyoiku Publications).

For preparation of a dispersion of the semiconductor ultrafine particles, there may be employed a method of depositing the fine particles from a solvent as the co-precipitation product of a chemical reaction, or a method using ultrasonic irradiation or mechanical crushing for pulverization into ultrafine particles and dispersion.

The porous semiconductor layer is preferably formed by a coating method. Specifically, a dispersion of the semiconductor ultrafine particles is preferably coated onto the transparent semiconductor layer of the laminated film and heated to dryness, for anchoring of a porous semiconductor layer on the transparent conductive layer.

The dispersion medium used may be water or an organic solvent. For the dispersion, a small amount of a polymer such as polyethylene glycol, hydroxyethyl cellulose or carboxymethyl cellulose, a surfactant or an acid or chelating agent may be added if necessary.

The dispersion of the semiconductor ultrafine particles is coated for a semiconductor fine particle amount of preferably 0.5-20 $g/m^2$ and more preferably 5-10 $g/m^2$, with respect to 1 $m^2$ of the support. The coating may be accomplished by any desired method that has hitherto been commonly employed for coating. For example, a roller method, dip method, air knife method, blade method, wire bar method, slide hopper method, extrusion method or curtain method may be used. There may also be employed a spin method or spray method using a general purpose machine. Coating may also be accomplished by any of the three major known printing methods, i.e. relief printing, offset printing and gravure printing, as well as wet printing such as intaglio printing, rubber plate printing or screen printing. The most suitable film-forming method may be selected as appropriate for the solution viscosity and wet thickness.

The porous semiconductor layer is formed to a thickness of preferably 1-30 µm, more preferably 2-10 µm and even more preferably 2-6 µm. This range can yield a high degree of transparency.

The porous semiconductor layer may be subjected to irradiation with light that is strongly absorbed by the ultrafine particles, such as ultraviolet light, or to microwave irradiation, to reinforce physical bonding between the ultrafine particles.

A primary coating layer may also be formed on the transparent conductive layer beforehand in order to prevent electrical shorting of the porous semiconductor-bearing transparent conductive layer with the counter electrode. In this case, the thickness of the primary coating layer is preferably 5-1000 nm and more preferably 10-500 nm. The material for the primary coating layer is preferably $TiO_2$, $SnO_2$, ZnO or $Nb_2O_5$, and is most preferably $TiO_2$. The primary coating layer may be formed by the spray pyrolysis method or sputtering method, as described in Electrochim, Acta 40, 643-652 (1995), for example.

<Fabrication of Dye-sensitized Solar Cell>

A publicly known process for production of dye-sensitized solar cells may be employed for fabrication of the dye-sensitized solar cell using the electrode for a dye-sensitized solar cell according to the invention. The following is an example of a process that may be employed.

(1) Production of Electrode A

A dye is adsorbed onto the porous semiconductor layer of the electrode of the invention. Specifically, a dye having the property of absorbing light in the visible light region or infrared light region, such as an organometallic complex dye, e.g. ruthenium-piperidine complex (ruthenium complex), or a cyanine-based dye, coumarin-based dye, xanthene-based dye or porphyrin-based dye, is dissolved in a solvent such as an alcohol or toluene to form a dye solution, and the porous semiconductor layer is dipped into the dye solution or the dye solution is sprayed or applied onto the porous semiconductor layer.

(2) Production of Electrode B (Counter Electrode)

A thin platinum layer is formed on the transparent conductive layer side of the laminated film by sputtering to form the counter electrode.

(3) Contact Bonding of Electrodes

The aforementioned electrode A and electrode B are stacked together separated by an inserted frame spacer (20 µm thickness) made of a thermocompression bonding polyethylene film, and the spacer section is heated to 120° C. for contact bonding. The edges of the obtained structure are sealed with an epoxy resin adhesive.

(4) Electrolyte Injection

An aqueous electrolyte solution containing lithium iodide and iodine (3:2 molar ratio) and 3 wt % nylon beads with a mean particle size of 20 µm as spacers is injected through a small hole for electrolyte solution injection which is preformed at the corner of the structure. The interior is then sufficiently deaired and finally the small hole is sealed with an epoxy resin adhesive.

The laminated film for a dye-sensitized solar cell and the electrode for a dye-sensitized solar cell according to the invention may be used to produce a dye-sensitized solar cell by the aforementioned process, explained as an example.

EXAMPLES

The present invention will now be explained in greater detail by examples.

The values for each of the properties in the examples were measured by the methods described below.

(1) Intrinsic Viscosity

The intrinsic viscosity η (dl/g) was calculated upon measurement at 35° C. with an o-chlorophenol solution.

(2) Film Thickness

A micrometer (Model K-402B by Anritsu Corp.) was used for film thickness measurement at spacings of 10 cm in the continuous machine direction and transverse direction of the film, with measurement at a total of 300 locations on the film. The average value for the film thickness at the 300 locations was calculated as the film thickness.

(3) Heat Shrinkage Rate

The film was held without tension for 10 minutes in an oven set to a temperature of 200° C., and the dimensional change in the film machine direction (MD) and transverse direction (TD) before and after heat treatment was calculated as the heat shrinkage rate using the following formula, to determine the heat shrinkage rate in both the machine direction (MD) and transverse direction (TD).

Heat shrinkage rate %=((L0−L)/L0)×100

(L0: gauge length before heat treatment, L: gauge length after heat treatment)

(4) Coated Layer Thickness

A small piece of the film was embedded in an epoxy resin (EPOMOUNT, by Refinetec Co., Ltd.) and sliced together with the embedding resin to a thickness of 50 nm using a Microtome 2050 by Reichert-Jung Corp., after which it was observed with a transmission electron microscope (LEM-2000) at an acceleration voltage of 100 KV and a magnification of 100,000 times, for measurement of the coated layer thickness.

(5) Surface Resistance

A 4-pin probe surface resistivity meter (LORESTA GP, product of Mitsubishi Chemical Co., Ltd.) was used for measurement at 5 arbitrary points and the average was used as the representative value.

(6) Surface Tension

The contact angles θw and θy for water and methylene iodide, having known surface tensions, were measured on the transparent conductive thin-film at 25° C., 50% RH using a contact angle meter (CA-X product of Kyowa Interface Science Co., Ltd.). The measured values were used to calculate the surface tension γs of the transparent conductive thin-film in the following manner.

The surface tension γs of the transparent conductive thin-film is the sum of the dispersing component γsd and the polar component γsp. That is, $$\gamma s = \gamma sd + \gamma sp \quad \text{(Formula 1)}$$

And, using the Young formula:

$$\gamma s = \gamma sw + \gamma w \cdot \cos \theta w \quad \text{(Formula 2)}$$

$$\gamma s = \gamma sy + \gamma y \cdot \cos \theta y \quad \text{(Formula 3)}$$

Here, γsw is the tension acting between the transparent conductive thin-film and water, γsy is the tension acting between the transparent conductive thin-film and methylene iodide, γw is the surface tension of water and γy is the surface tension of methylene iodide.

According to the Fowkes formula, this is:

$$\gamma sw = \gamma s + \gamma w - 2 \times (\gamma sd \cdot \gamma wd)^{1/2} - 2 \times (\gamma sp \cdot \gamma wp)^{1/2} \quad \text{(Formula 4)}$$

$$\gamma sy = \gamma s + \gamma y - 2 \times (\gamma sd \cdot \gamma yd)^{1/2} - 2 \times (\gamma sp \cdot \gamma yp)^{1/2} \quad \text{(Formula 5)}$$

Here, γwd is the dispersing component of the surface tension of water, γwp is the polar component of the surface tension of water, γyd is the dispersing component of the surface tension of methylene iodide and γyp is the polar component of the surface tension of methylene iodide.

Solving the simultaneous equations of formulas 1-5 allows calculation of the surface tension of the transparent conductive thin-film, γs=γsd+γsp. The values used here were: water surface tension (γw)=72.8 mN/m, methylene iodide surface tension (γy)=50.5 mN/m, water surface tension dispersing component (γwd)=21.8 mN/m, water surface tension polar component (γwp)=51.0 mN/m, methylene iodide surface tension dispersing component (γyd)=49.5 mN/m, methylene iodide surface tension polar component (γyp)=1.3 mN/m.

(7) Porous Semiconductor Layer Cohesion

Gauze was passed over 5 times on the porous semiconductor layer surface at a 50 g/cm² load, and the degree of peeling was visually evaluated. Lack of peeling was evaluated as ○, partial peeling was evaluated as Δ, and total peeling was evaluated as ×.

(8) Photogenerating Efficiency

A 25 mm² dye-sensitized solar cell was formed, and the open-circuit voltage, shorting current density, fill factor and photogenerating efficiency were determined by I-V measurement under irradiation of simulated AM1.5 sunlight at 100 mW/cm². A CEP-2000 photosensitivity meter by Bunko-Keiki Co., Ltd. was used for the measurement.

(9) I-V Characteristic (Photoelectric Current-voltage Characteristic)

A 25 mm² dye-sensitized solar cell was formed and the photogenerating efficiency was calculated by the following method. A sunlight simulating compensation filter (AM1.5 Global by Oriel) was mounted on a 500 W xenon lamp (Ushio Inc.), and the photogenerating device was irradiated with simulated sunlight at an incident photointensity of 100 mW/cm², while varying the incident angle with respect to the horizontal surface. The system was set indoors in an environment of 18° C. air temperature, 50% relative humidity. A current-voltage meter (Source measure unit 238 by Keithley Instruments, Inc.) was used to measure the outputted photoelectric current of the element upon scanning of the DC voltage applied to the system at a fixed speed of 10 mV/sec, in order to determine the photoelectric current-voltage characteristic, from which the photogenerating efficiency was calculated.

(10) Weather Resistance Acceleration Test

A sunshine weathermeter (WEL-SUN-HCL by Suga Test Instruments Co., Ltd.) was used for an exposure acceleration test with 1000 hours of irradiation, according to JIS-K-6783.

Example 1

(Preparation of Acrylic Aqueous Dispersion)

In a four-necked flask there were charged 3 parts by weight of sodium lauryl sulfonate as a surfactant and 181 parts by weight of ion-exchanged water, and the temperature was raised to 60° C. under a nitrogen stream. Next, 0.5 part by weight of ammonium persulfate and 0.2 part by weight of sodium hydrogennitrite were added as polymerization initiators. A mixture of monomers comprising 30.1 parts by weight of methyl methacrylate, 21.9 parts by weight of 2-isopropenyl-2-oxazoline, 39.4 parts by weight of polyethylene oxide (n=10) methacrylic acid and 8.6 parts by weight of acrylamide was then added dropwise. The dropwise addition was carried out with adjustment of the liquid temperature of the reaction system to 60-70° C., and 3 hours were required. Upon completion of the dropwise addition, the mixture was stirred for 2 hours while keeping the liquid temperature of the reaction system in the range of 60-70° C., for continuation of the reaction. It was then cooled to obtain an acrylic aqueous dispersion with a solid content of 35 wt %.

(Preparation of Silica Filler Aqueous Dispersion)

A silica filler aqueous dispersion was prepared containing 0.2 wt % of a silica filler (SNOWTEX ZL, trade name of Nissan Chemical Industries, Ltd., mean particle size: 100 nm) and 0.3 wt % of polyoxyethylene(n=7) laurylether (NAROACTY N-70, trade name of Sanyo Chemical Industries, Ltd.) as a wetting agent.

(Preparation of Coating Agent A)

Coating agent A was prepared by mixing 15 parts by weight of the acrylic aqueous dispersion and 85 parts by weight of the silica filler aqueous dispersion.

(Formation of Polyester for Film)

Ester-exchange reaction was conducted for 120 minutes using 100 parts by weight of dimethyl naphthalene-2,6-dicarboxylate and 60 parts by weight of ethylene glycol, and using 0.03 part by weight of manganese acetate tetrahydrate as the ester-exchange reaction catalyst, with gradual temperature increase of the reaction system from 150° C. to 238° C. During the reaction, 0.024 part by weight of antimony trioxide was added at the point when the reaction temperature reached 170° C. Upon completion of the ester-exchange reaction, 0.023 part by weight of trimethyl phosphate was added as an ethylene glycol solution of trimethyl phosphate. The ethylene glycol solution of trimethyl phosphate was prepared beforehand by heating trimethyl phosphate in ethylene glycol at 135° C. for 5 hours under 0.11-0.16 MPa pressurization. Upon transfer to a polymerization reactor, the temperature was raised to 290° C. for polycondensation under a high vacuum of no greater than 27 Pa. This yielded a substantially particle-free polyethylene-2,6-naphthalene dicarboxylate polymer (intrinsic viscosity: 0.63 dl/g).

(Formation of Biaxial Stretched Film)

The polyethylene-2,6-naphthalene dicarboxylate polymer was dried for 6 hours at 170° C. in pellet form and supplied to an extruder hopper, and then melted at a melting temperature of 305° C., filtered with a stainless steel wire filter with a 17 µm mean pore size, passed through a 3 mm slit die, extruded onto a rotary cooling drum with a surface temperature of 60° C. and cooled to obtain an unstretched film. The unstretched film was preheated at 120° C. and then heated between a low-speed roll and a high-speed roll using an IR heater at 850° C. situated 15 mm above, and stretched to a factor of 3.2 in the machine direction to obtain a longitudinally stretched film. One side of the longitudinally stretched film was coated with the previously prepared coating agent A using a roll coater, to form a readily adhesive layer. The coating amount of coating agent A was adjusted for a post-drying thickness of 0.2 µm for the readily adhesive layer. The film was fed to a tenter and stretched to a factor of 3.4 in the transverse direction at 140° C., and then heat set at 244° C. for 5 seconds to obtain a biaxial stretched film with a readily adhesive layer. The film had an intrinsic viscosity of 0.59 dl/g, a thickness of 125 µm, and upon heat treatment at 200° C. for 10 minutes, a heat shrinkage rate of 0.58% in the machine direction, a heat shrinkage rate of 0.12% in the transverse direction and a difference of 0.46% in the heat shrinkage rates in the machine and transverse directions.

(Formation of Hard Coat Layer)

The readily adhesive layer of the biaxial stretched film provided with the readily adhesive layer was coated with a UV-curing hard coat agent (DeSolite R7501, trade name of JSR) to a thickness of about 5 µm, and irradiated with ultraviolet rays for curing to form a hard coat layer. A laminated film with a hard coat layer was thus obtained.

(Formation of Transparent Conductive Layer)

An ITO transparent conductive layer with a film thickness of 400 nm was formed on the hard coat layer of the laminated film. Formation of the transparent conductive layer is accomplished by direct-current magnetron sputtering using an ITO target (with a tin concentration of 10 wt % in terms of tin dioxide). Specifically, after evacuating the chamber interior prior to plasma discharge to $5 \times 10^{-4}$ Pa, a mixed gas of argon and oxygen (oxygen concentration: 0.5 vol %) was introduced into the chamber, the pressure was set to 0.3 Pa and 1000 W was applied to the ITO target. The surface resistance of the obtained transparent conductive layer was 20 Ω/□.

Next, an ordinary pressure plasma surface treatment apparatus (AP-T03-L by Sekisui Chemical Industries, Ltd.) was used for plasma treatment of the transparent conductive layer surface at 1 m/min under a nitrogen stream (60 L/min). The surface resistance value of the transparent conductive layer after plasma treatment was 22Ω/□, and the surface tension was 72.3 mN/m.

(Formation of Anti-reflection Layer)

On the other side of the laminated film (the side without the transparent conductive layer) there were formed a $Y_2O_3$ layer with a thickness of 75 nm and a refractive index of 1.89, a $TiO_2$ layer thereover with a thickness of 120 nm and a refractive index of 2.3, and an $SiO_2$ layer thereover with a thickness of 90 nm and a refractive index of 1.46. These layers function as anti-reflection layers. The layers were formed by different high-frequency sputtering methods, and all were formed at a vacuum of $1 \times 10^{-3}$ Torr while flowing through Ar: 55 sccm and $O_2$: 5 sccm as gas. The temperature was room temperature, without heating or cooling.

(Formation of Porous Semiconductor Layer)

A paste for formation of a low-temperature-forming porous titanium dioxide layer (SP-200, trade name of Showa Denko K.K.) was coated onto the transparent conductive layer of the laminated film with a bar coater and heat treated for 30 minutes in air at 180° C. to form a porous titanium dioxide layer. The coating amount was adjusted for a porous titanium dioxide layer thickness of 5 µm. An electrode for a dye-sensitized solar cell was thus obtained having a porous titanium dioxide layer on the transparent conductive layer of the laminated film. Upon evaluating the cohesion of the porous semiconductor layer of this electrode, absolutely no peeling was found, leading to an evaluation of ○.

<Fabrication of Dye-sensitized Solar Cell>

The electrode was dipped in a 300 μM ethanol solution of a ruthenium complex (Ru535bisTBA, by Solaronix) for 24 hours for adsorption of the ruthenium complex on the light-activation electrode surface.

Also, a Pt film was accumulated on the transparent conductive layer of a laminated film by a sputtering method to obtain a counter electrode.

The electrode and counter electrode were stacked together via a frame spacer (20 μm thickness) made of a thermocompression bonding polyethylene film, and the spacer section was heated to 120° C. for contact bonding of the electrode and counter electrode. The edges were then sealed with an epoxy resin adhesive.

An electrolyte solution (a 3-methoxypropionitrile solution containing 0.5 M lithium iodide, 0.05 M iodine, 0.5 M tert-butylpyridine and 3 wt % nylon beads with a mean size of 20 μm) was then injected before sealing with an epoxy-based adhesive to obtain a dye-sensitized solar cell. The I-V characteristic (effective area: 25 mm$^2$) of the dye-sensitized solar cell was evaluated, indicating an open-circuit voltage of 0.72 V, a shorting current density of 6.3 mA/cm$^2$, a fill factor of 0.72 and a photogenerating efficiency of 3.2%.

Examples 2, 3 and Reference Example 1

A laminated film was obtained in the same manner as Example 1, except that the longitudinal stretch factor, transverse stretch factor and heat setting temperature for formation of the biaxial stretched film were changed to the values shown in Table 1. This was used in the same manner as Example 1 to fabricate an electrode and a dye-sensitized solar cell. The evaluation results are shown in Table 1.

TABLE 1

|  |  | Example 1 | Example 2 | Example 3 | Ref. Ex. 1 |
|---|---|---|---|---|---|
| Longitudinal stretch factor |  | 3.2 | 3.0 | 3.5 | 3.4 |
| Transverse stretch factor |  | 3.4 | 3.1 | 3.3 | 3.2 |
| Heat setting temperature ° C. |  | 244 | 245 | 240 | 235 |
| Heat shrinkage rate with heat treatment at 200° C. | Machine direction | 0.58 | 0.36 | 0.84 | 1.21 |
|  | Transverse direction | 0.12 | 0.08 | 0.31 | 0.35 |
|  | Difference | 0.46 | 0.28 | 0.53 | 0.86 |
| Porous semiconductor layer cohesion |  | ○ | ○ | ○ | Δ |
| Photogenerating efficiency % |  | 3.2 | 3.4 | 2.8 | 1.8 |

Example 4

A biaxial stretched film was fabricated in the same manner as Example 1. The film was then subjected to heat relaxation in a suspended state with a relaxation factor of 0.8% and a temperature of 205° C. Upon treatment at 200° C. for 10 minutes, the heat shrinkage rate in the lengthwise direction of the film was 0.15%, the heat shrinkage rate in the widthwise direction was 0.02% and the difference in heat shrinkage rates in the lengthwise and widthwise directions was 0.13%.

A hard coat layer and transparent conductive layer were formed on the film in the same manner as Example 1 to obtain a laminated film. A porous semiconductor layer was formed on the laminated film to fabricate a dye-sensitized solar cell. The conditions for formation of the porous semiconductor layer were the same as in Example 1, except that the heat treatment temperature after coating of the titanium dioxide paste was 200° C. Upon evaluating the cohesion of the porous semiconductor layer of this electrode, absolutely no peeling was found, leading to an evaluation of ○.

This electrode was used to fabricate a dye-sensitized solar cell in the same manner as Example 1. The I-V characteristic (effective area: 25 mm$^2$) of the dye-sensitized solar cell was evaluated, indicating an open-circuit voltage of 0.71 V, a shorting current density of 7.4 mA/cm$^2$, a fill factor of 0.75 and a photogenerating efficiency of 3.9%.

Examples 5, 6 and Comparative Examples 2, 3

Laminated films were fabricated in the same manner as Example 1, except that the proportion of nitrogen and oxygen gas used for plasma treatment was changed as shown in Table 2. No plasma treatment was carried out in Comparative Example 3. Electrodes and dye-sensitized solar cells were fabricated in the same manner as Example 1, and the porous semiconductor layer cohesion and cell photogenerating efficiency were evaluated. The results are shown in Table 2.

TABLE 2

|  |  | Example 4 | Example 5 | Example 6 | Comp. Ex. 2 | Comp. Ex. 3 |
|---|---|---|---|---|---|---|
| Gas proportion % | Nitrogen | 100 | 98 | 70 | 50 | (Untreated) |
|  | Oxygen | 0 | 2 | 30 | 50 |  |
| Surface resistance Ω/□ |  | 22 | 21 | 21 | 21 | 20 |
| Surface tension mN/m |  | 72.3 | 68.3 | 42.7 | 38.4 | 32.3 |
| Cohesion evaluation |  | ○ | ○ | ○ | Δ | x |
| Photogenerating efficiency % |  | 3.2 | 3.0 | 2.4 | 1.5 | 0.9 |

Example 7

(Preparation of Polyester Aqueous Dispersion)

After charging 48 parts by weight of dimethyl 2,6-naphthalenedicarboxylate, 14 parts by weight of dimethyl isophthalate, 4 parts by weight of dimethyl 5-sodiumsulfoisophthalate, 31 parts by weight of ethylene glycol and 2 parts by weight of diethylene glycol in a reactor, 0.05 part by weight of tetrabutoxytitanium was added and the mixture was heated in a nitrogen atmosphere with control of the temperature to 230° C. for ester-exchange reaction, while distilling off the methanol produced. The temperature of the reaction system was then slowly raised to 255° C. and the pressure in the system was reduced to 1 mmHg for polycondensation reaction to obtain a polyester. A solution was obtained by dissolving 25 parts by weight of the polyester in 75 parts by weight of tetrahydrofuran. After adding dropwise 75 parts by weight of water to the solution with high-speed stirring at 10,000 rpm to obtain a milky white dispersion, it was distilled under reduced pressure at 20 mmHg to distill off the tetrahydrofuran, yielding a polyester aqueous dispersion with a solid content of 25 wt %.

(Preparation of Acrylic Aqueous Dispersion)

An acrylic aqueous dispersion was prepared in the same manner as Example 1.

(Preparation of Silica Filler Aqueous Dispersion)

A silica filler aqueous dispersion was prepared in the same manner as Example 1.

(Preparation of Coating Agent B)

Coating agent B was prepared by mixing 10 parts by weight of the polyester aqueous dispersion, 5 parts by weight of the acrylic aqueous dispersion and 85 parts by weight of the silica filler aqueous dispersion.

(Formation of Biaxial Stretched Film)

Polyethylene terephthalate (intrinsic viscosity: 0.65 dl/g) containing 1 wt % of the ultraviolet absorber shown as structural formula (A) below was melted, extruded onto a rotary cooling drum kept at 20° C. and rapidly cooled to obtain an unstretched film.

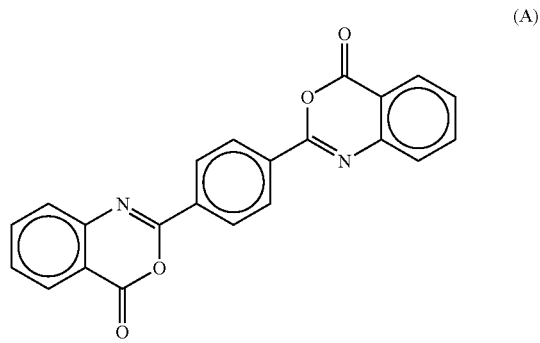

(A)

The unstretched film was stretched to a factor of 3.4 in the machine direction at 100° C., and then both sides thereof were evenly coated with coating agent B using a roll coater to obtain a longitudinally stretched film with a readily adhesive layer of coating agent B. Next, the longitudinally stretched film was dried at 95° C., stretched to a factor of 3.7 in the transverse direction at 120° C. and then contracted 3% in the transverse direction at 220° C. for heat setting to obtain a biaxial stretched film with a readily adhesive layer. The thickness of the obtained biaxial stretched film was 125 µm, the thickness of the readily adhesive layer was 0.08 µm, the light transmittance of the film at a wavelength of 370 nm was 0.5% and the light transmittance at 400 nm was 83.9%.

(Formation of Hard Coat Layer)

The readily adhesive layer of the biaxial stretched film provided with the readily adhesive layer was coated with a UV-curing hard coat agent (DeSolite R7501, trade name of JSR) to a thickness of about 5 µm, and irradiated with ultraviolet rays for curing to form a hard coat layer. A laminated film with a hard coat layer was thus obtained.

(Formation of Transparent Conductive Layer)

An ITO transparent conductive layer with a film thickness of 400 nm was formed on the hard coat layer of the laminated film. The transparent conductive layer was formed in the same manner as Example 1. The surface resistance of the obtained transparent conductive layer was 15Ω/□.

The surface of the transparent conductive layer was subjected to plasma treatment in the same manner as Example 1. The surface resistance value of the transparent conductive layer after plasma treatment was 16Ω/□, and the surface tension was 70.5 mN/m.

(Formation of Anti-reflection Layer)

On the other side of the laminated film (the side without the transparent conductive layer) there were formed a $TiO_x$ layer with a thickness of 80 nm and a refractive index of 1.75, a $TiO_2$ layer thereover with a thickness of 70 nm and a refractive index of 2.1, and an $SiO_2$ layer thereover with a thickness of 95 nm and a refractive index of 1.45. These layers function as anti-reflection layers. The layers were formed by different high-frequency sputtering methods, and all were formed at a vacuum of $5 \times 10^{-4}$ Torr while flowing through Ar: 55 sccm and $O_2$: 5 sccm as gas. The temperature was room temperature, without, heating or cooling.

(Formation of Porous Semiconductor Layer)

A paste for formation of a low-temperature-forming porous titanium dioxide layer (SP-200, trade name of Showa Denko K.K.) was coated onto the transparent conductive layer of the laminated film with a bar coater and heat treated for 30 minutes in air at 160° C. to form a porous titanium dioxide layer. The coating amount was adjusted for a porous titanium dioxide layer thickness of 4 µm. An electrode for a dye-sensitized solar cell was thus obtained having a porous titanium dioxide layer on the transparent conductive layer of the laminated film. Upon evaluating the cohesion of the porous semiconductor layer of this electrode, absolutely no peeling was found, leading to an evaluation of ○.

<Fabrication of Dye-sensitized Solar Cell>

This electrode was used to fabricate a dye-sensitized solar cell in the same manner as Example 1. The I-V characteristic (effective area: 25 $mm^2$) of the obtained dye-sensitized solar cell was evaluated, indicating an open-circuit voltage of 0.68 V, a shorting current density of 5.8 mA/$cm^2$, a fill factor of 0.69 and a photogenerating efficiency of 2.7%.

This dye-sensitized solar cell was also subjected to a weather resistance test and the I-V characteristic (effective area: 25 $mm^2$) was re-evaluated, indicating an open-circuit voltage of 0.69 V, a shorting current density of 5.2 mA/$cm^2$, a fill factor of 0.67 and extremely minimal reduction in photogenerating efficiency.

Example 8

Polyethylene naphthalenedicarboxylate (intrinsic viscosity: 0.61 dl/g) containing 2 wt % of the ultraviolet absorber shown in structural formula (B) below was melted, extruded onto a rotary cooling drum kept at 60° C. and rapidly cooled to obtain an unstretched film.

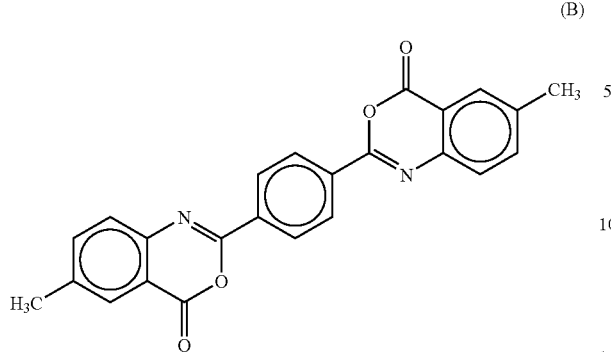

(B)

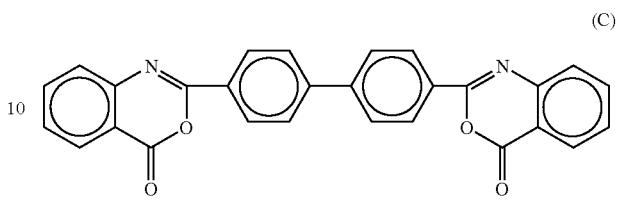

(C)

The unstretched film was stretched to a factor of 3.3 in the machine direction at 140° C., and then both sides thereof were evenly coated with coating agent B using a roll coater to obtain a longitudinally stretched film with a readily adhesive layer of coating agent B. Next, the longitudinally stretched film was dried at 120° C., stretched to a factor of 3.5 in the transverse direction at 145° C. and then contracted 2% in the transverse direction at 240° C. for heat setting to obtain a biaxial stretched film with a readily adhesive layer. The thickness of the obtained biaxial stretched film was 100 μm, the thickness of the readily adhesive layer was 0.08 μm, the light transmittance of the film at a wavelength of 370 nm was 0.5% and the light transmittance at 400 nm was 83.9%.

A hard coat layer and transparent conductive layer were formed on the biaxial stretched film in the same manner as Example 7. The surface resistance of the obtained transparent conductive layer was 18 Ω/□.

Next, the ordinary pressure plasma surface treatment apparatus used in Example 7 was used for plasma treatment of the transparent conductive layer surface at a speed of 1 m/min, under a mixed gas stream of 5% oxygen, 95% nitrogen (60 L/min). The surface resistance value of the transparent conductive layer was 18Ω/□, and the surface tension was 66.2 mN/m.

An anti-reflection layer and porous semiconductor layer were then formed on the transparent conductive layer in the same manner as Example 7. An electrode for a dye-sensitized solar cell was thus obtained having a porous titanium dioxide layer on the transparent conductive layer of the laminated film. Upon evaluating the cohesion of the porous semiconductor layer of this electrode, absolutely no peeling was found, leading to an evaluation of ○.

This electrode was used to fabricate a dye-sensitized solar cell in the same manner as Example 7. The I-V characteristic (effective area: 25 mm²) of the obtained dye-sensitized solar cell was evaluated, indicating an open-circuit voltage of 0.65 V, a shorting current density of 5.4 mA/cm², a fill factor of 0.70 and a photogenerating efficiency of 2.5%.

This dye-sensitized solar cell was also subjected to a weather resistance test and the I-V characteristic (effective area: 25 mm²) was re-evaluated, indicating an open-circuit voltage of 0.64 V, a shorting current density of 5.2 mA/cm², a fill factor of 0.69 and a photogenerating efficiency of 2.3%, with an extremely minimal reduction in photogenerating efficiency.

Example 9

A biaxial stretched film with a readily adhesive layer was fabricated in the same manner as Example 7, except that the ultraviolet absorber containing polyethylene terephthalate was changed to the compound shown in structural formula (C) below. The obtained biaxial stretched film had a light transmittance of 0.3% at a wavelength of 370 nm and a light transmittance of 81.2% at 400 nm.

A hard coat layer and transparent conductive layer were formed on the biaxial stretched film in the same manner as Example 7. The surface resistance of the obtained transparent conductive layer was 20 Ω/□.

Next, the ordinary pressure plasma surface treatment apparatus used in Example 7 was used for plasma treatment of the transparent conductive layer surface at a speed of 1 m/min, under a mixed gas stream of 30% oxygen, 70% nitrogen (60 L/min). The surface resistance value of the transparent conductive layer was 21Ω/□, and the surface tension was 43.2 mN/m.

An anti-reflection layer and porous semiconductor layer were then formed on the transparent conductive layer in the same manner as Example 7, to fabricate an electrode. Upon evaluating the cohesion of the porous semiconductor layer of this electrode, absolutely no peeling was found, leading to an evaluation of ○.

This electrode was used to fabricate a dye-sensitized solar cell in the same manner as Example 7. The I-V characteristic (effective area: 25 mm²) of the dye-sensitized solar cell was evaluated, indicating an open-circuit voltage of 0.66 V, a shorting current density of 5.0 mA/cm², a fill factor of 0.65 and a photogenerating efficiency of 2.1%.

This dye-sensitized solar cell was also subjected to a weather resistance test and the I-V characteristic (effective area: 25 mm²) was re-evaluated, indicating an open-circuit voltage of 0.66 V, a shorting current density of 4.7 mA/cm², a fill factor of 0.63 and a photogenerating efficiency of 2.0%, with an extremely minimal reduction in photogenerating efficiency.

Reference Example 4

An electrode for a dye-sensitized solar cell was fabricated in the same manner as Example 7, except that no ultraviolet absorber was added to the polyethylene terephthalate. The biaxial stretched film had a light transmittance of 84.6% at a wavelength of 370 nm and a light transmittance of 87.7% at 400 nm.

This electrode was used to fabricate a dye-sensitized solar cell in the same manner as Example 7, and evaluation of the I-V characteristic (effective area: 25 mm²) indicated an open-circuit voltage of 0.69 V, a shorting current density of 6.2 mA/cm², a fill factor of 0.68 and a photogenerating efficiency of 2.9%.

This dye-sensitized solar cell was also subjected to a weather resistance test and the I-V characteristic (effective area: 25 mm²) was re-evaluated, indicating an open-circuit voltage of 0.63 V, a shorting current density of 2.2 mA/cm², a fill factor of 0.58 and a photogenerating efficiency of 0.8%.

Reference Example 5

An electrode for a dye-sensitized solar cell was fabricated in the same manner as Example 7, except that an ultraviolet absorber containing polyethylene terephthalate was added at 6 wt %. The biaxial stretched film had a light transmittance of 0.1% at a wavelength of 370 nm and a light transmittance of 66.2% at 400 nm.

This electrode was used to fabricate a dye-sensitized solar cell in the same manner as Example 7. Evaluation of the I-V characteristic (effective area: 25 mm$^2$) indicated an open-circuit voltage of 0.62 V, a shorting current density of 4.1 mA/cm$^2$, a fill factor of 0.64 and a photogenerating efficiency of 1.6%.

Comparative Example 6

An electrode was fabricated in the same manner as Example 7, except that the proportion of nitrogen and oxygen gas used for plasma treatment was 50%:50%. The surface tension of the transparent conductive layer after plasma treatment was 37.8 mN/m. Upon evaluation of the cohesion of the porous semiconductor layer of the electrode, partial peeling was observed, leading to an evaluation of Δ.

This electrode was used to fabricate a dye-sensitized solar cell in the same manner as Example 7. Evaluation of the I-V characteristic (effective area: 25 mm$^2$) indicated an open-circuit voltage of 0.58 V, a shorting current density of 4.2 mA/cm$^2$, a fill factor of 0.59 and a photogenerating efficiency of 1.4%.

Example 10

(Preparation of Polyester Aqueous Dispersion)

After charging 92 parts by weight of dimethyl terephthalate, 12 parts by weight of dimethyl isophthalate, 17 parts by weight of 5-sodiumsulfoisophthalic acid, 54 parts by weight of ethylene glycol and 62 parts by weight of diethylene glycol in a reactor, 0.05 part by weight of tetrabutoxytitanium was added and the mixture was heated in a nitrogen atmosphere while controlling the temperature to 230° C., for ester-exchange reaction while distilling off the methanol produced. The temperature of the reaction system was then slowly raised to 255° C. and the pressure in the system was reduced to 1 mmHg for polycondensation reaction to obtain a polyester. A solution was obtained by dissolving 25 parts by weight of the polyester in 75 parts by weight of tetrahydrofuran. After adding dropwise 75 parts by weight of water to the solution with high-speed stirring at 10,000 rpm to obtain a milky white dispersion, it was distilled under reduced pressure at 20 mmHg to distill off the tetrahydrofuran, yielding a polyester aqueous dispersion with a solid content of 25 wt %.

(Preparation of Acrylic Aqueous Dispersion)

In a four-necked flask there were charged 3 parts by weight of sodium lauryl sulfonate as a surfactant and 181 parts by weight of ion-exchanged water, and the temperature was raised to 60° C. under a nitrogen stream. Next, 0.5 part by weight of ammonium persulfate and 0.2 part by weight of sodium hydrogennitrite were added as polymerization initiators. A mixture of 70 parts by weight of methyl methacrylate, 25 parts by weight of ethyl acrylate and 5 parts by weight of N-methylolacrylamide was then added dropwise as monomer. The dropwise addition was carried out with adjustment of the liquid temperature of the reaction system to 60-70° C., and 3 hours were required. Upon completion of the dropwise addition, the mixture was stirred for 2 hours while keeping the liquid temperature of the reaction system in the range of 60-70° C., for continuation of the reaction. It was then cooled to obtain an acrylic aqueous dispersion with a solid content of 35 wt %.

(Preparation of Silica Filler Aqueous Dispersion)

An aqueous dispersion was prepared containing 0.3 wt % of a silica filler (mean particle size: 100 nm) (SNOWTEX ZL, trade name of Nissan Chemical Industries, Ltd.) and 0.4 wt % of polyoxyethylene(n=9) laurylether (EMULGEN 109P, trade name of Kao Corp.) as a wetting agent.

(Preparation of Coating Agent C)

Coating agent C was prepared by mixing 10 parts by weight of the polyester aqueous dispersion, 3 parts by weight of the acrylic aqueous dispersion and 87 parts by weight of the silica filler aqueous dispersion.

(Preparation of Polyester Aqueous Dispersion)

After charging 66 parts by weight of dimethyl 2,6-naphthalenedicarboxylate, 47 parts by weight of dimethyl isophthalate, 8 parts by weight of dimethyl 5-sodiumsulfoisophthalate, 54 parts by weight of ethylene glycol and 62 parts by weight of diethylene glycol in a reactor, 0.05 part by weight of tetrabutoxytitanium was added and the mixture was heated in a nitrogen atmosphere while controlling the temperature to 230° C., for ester-exchange reaction while distilling off the methanol produced. The temperature of the reaction system was then slowly raised to 255° C. and the pressure in the system was reduced to 1 mmHg for polycondensation reaction to obtain a polyester. A solution was obtained by dissolving 25 parts by weight of the polyester in 75 parts by weight of tetrahydrofuran. After adding dropwise 75 parts by weight of water to the solution with high-speed stirring at 10,000 rpm to obtain a milky white dispersion, it was distilled under reduced pressure at 20 mmHg to distill off the tetrahydrofuran, yielding a polyester aqueous dispersion with a solid content of 25 wt %.

(Preparation of Acrylic Aqueous Dispersion)

An acrylic aqueous dispersion was prepared in the same manner as Example 1.

(Preparation of Silica Filler Aqueous Dispersion)

A silica filler aqueous dispersion was prepared in the same manner as Example 1.

(Preparation of Coating Agent D)

Coating agent D was prepared by mixing 8 parts by weight of the polyester aqueous dispersion, 7 parts by weight of the acrylic aqueous dispersion and 85 parts by weight of the silica filler aqueous dispersion.

(Formation of Polyester for Film)

Polyethylene-2,6-naphthalenedicarboxylate was produced as a film polyester in the same manner as Example 1. The polyethylene-2,6-naphthalenedicarboxylate had an intrinsic viscosity of 0.62 dl/g and was a substantially particle-free polymer.

(Formation of Biaxial Stretched Film)

The polyethylene-2,6-naphthalene dicarboxylate polymer was dried for 6 hours at 170° C. in pellet form and supplied to an extruder hopper, and then melted at a melting temperature of 305° C., filtered with a stainless steel wire filter with a 17 μm mean pore size, passed through a 3 mm slit die, extruded onto a rotary cooling drum with a surface temperature of 60° C. and cooled to obtain an unstretched film.

The unstretched film was preheated at 120° C. and then heated between a low-speed roll and a high-speed roll using an IR heater at 850° C. situated 15 mm above, and stretched to a factor of 3.2 in the machine direction to obtain a longitudinally stretched film. One side of the longitudinally stretched film was coated with the previously prepared coating agent C using a roll coater, to form a readily adhesive layer. The coating amount of coating agent C was adjusted for a post-drying thickness of 0.08 μm for the readily adhesive layer. The film was fed to a tenter and stretched to a factor of 3.3 in the transverse direction at 140° C., and then heat set at 244° C.

for 5 seconds to obtain a biaxial stretched film with a readily adhesive layer. The film had an intrinsic viscosity of 0.58 dl/g, a thickness of 125 μm, and upon heat treatment at 200° C. for 10 minutes, a heat shrinkage rate of 0.58% in the machine direction, a heat shrinkage rate of 0.12% in the transverse direction and a difference of 0.46% in the heat shrinkage rates in the machine and transverse directions.

(Formation of Transparent Conductive Layer)

A transparent conductive layer made of ITO with a film thickness of 280 nm was formed on the other side of the biaxial stretched film (the side with no transparent conductive layer) by the method described in Example 6 of Japanese Unexamined Patent Publication SHO No. 63-908. A biaxial stretched film with a transparent conductive layer was thus obtained. The surface resistance of the transparent conductive layer was 18 Ω/□.

Next, an ordinary pressure plasma surface treatment apparatus (AP-T03-L by Sekisui Chemical Industries, Ltd.) was used for plasma treatment of the transparent conductive layer surface at 1 m/min under a nitrogen stream (60 L/min). The surface resistance value of the transparent conductive layer after plasma treatment was 18Ω/□, and the surface tension was 71.5 mN/m.

(Formation of Anti-reflection Layer)

An anti-reflection layer was formed in the same manner as Example 1.

(Formation of Porous Semiconductor Layer)

A paste for formation of a low-temperature-forming porous titanium dioxide layer (SP-200, trade name of Showa Denko K.K.) was coated onto the transparent conductive layer of the film with a bar coater and heat treated for 30 minutes in air at 200° C. to form a porous titanium dioxide layer. The coating amount was adjusted for a porous titanium dioxide layer thickness of 5 μm. An electrode for a dye-sensitized solar cell was thus obtained having a porous titanium dioxide layer on the biaxial stretched film. Upon evaluating the cohesion of the porous semiconductor layer of this electrode, absolutely no peeling was found, leading to an evaluation of ○.

(Fabrication of Dye-sensitized Solar Cell)

The electrode was dipped in a 300 μM ethanol solution of a ruthenium complex (Ru535bisTBA, by Solaronix) for 24 hours for adsorption of the ruthenium complex on the light-activation electrode surface.

Also, a Pt film was accumulated on the transparent conductive layer of the biaxial stretched film by a sputtering method to obtain a counter electrode.

This electrode and counter electrode were used to fabricated dye-sensitized solar cell in the same manner as Example 1. The I-V characteristic (effective area: 25 mm$^2$) of the obtained dye-sensitized solar cell was evaluated, indicating an open-circuit voltage of 0.71 V, a shorting current density of 7.1 mA/cm$^2$, a fill factor of 0.68 and a photogenerating efficiency of 3.4%.

Examples 11, 12 and Reference Example 7

A biaxial stretched film was obtained in the same manner as Example 10, except that the longitudinal stretch factor, transverse stretch factor and heat setting temperature for formation of the biaxial stretched film were changed to the values shown in Table 3. This was used to obtain an electrode and a dye-sensitized solar cell in the same manner as Example 10. The heat shrinkage rates of the biaxial stretched film in the machine direction and transverse direction after treatment at 200° C. for 10 minutes, the difference between them, the cohesion of the porous semiconductor layer and the photogenerating efficiency of the dye-sensitized solar cell are shown in Table 3.

TABLE 3

|  |  | Example 10 | Example 11 | Example 12 | Ref. Ex. 7 |
|---|---|---|---|---|---|
| Longitudinal stretch factor |  | 3.2 | 3.0 | 3.3 | 3.4 |
| Transverse stretch factor |  | 3.3 | 3.1 | 3.1 | 3.2 |
| Heat setting temperature ° C. |  | 244 | 244 | 238 | 236 |
| Heat shrinkage rate with heat treatment at 200° C. | Machine direction | 0.55 | 0.37 | 0.82 | 1.17 |
|  | Transverse direction | 0.10 | 0.09 | 0.29 | 0.32 |
|  | Difference | 0.45 | 0.28 | 0.53 | 0.85 |
| Cohesion of porous semiconductor layer |  | ○ | ○ | ○ | Δ |
| Photogenerating efficiency % |  | 3.4 | 3.7 | 2.7 | 1.5 |

Example 13

(Formation of Biaxial Stretched Film)

After forming a biaxial stretched film in the same manner as Example 10 except for using coating agent D as the coating agent for formation of the readily adhesive layer, the film was subjected to heat relaxation in a suspended state with a relaxation factor of 0.8% and a temperature of 205° C. Upon treatment of the obtained biaxial stretched film at 200° C. for 10 minutes, the heat shrinkage rate in the lengthwise direction of the film was 0.13%, the heat shrinkage rate in the widthwise direction was 0.03% and the difference in heat shrinkage rates in the lengthwise and widthwise directions was 0.10%.

(Formation of Hard Coat Layer)

A hard coat layer was formed on the biaxial stretched film in the same manner as Example 1, to obtain a laminated film with a hard coat layer.

(Formation of Transparent Conductive Layer)

A transparent conductive layer was formed on the hard coat layer of the laminated film in the same manner as Example 1. The surface resistance of the obtained transparent conductive layer was 19 Ω/□.

The surface of the transparent conductive layer was then subjected to plasma treatment in the same manner as Example 1. The surface resistance value of the transparent conductive layer after plasma treatment was 20Ω/□, and, the surface tension was 71.8 mN/m.

(Formation of Anti-reflection Layer)

An anti-reflection layer was formed on the other side of the laminated film (the side without the transparent conductive layer) in the same manner as Example 10.

(Formation of Porous Semiconductor Layer)

A porous semiconductor layer was formed in the same manner as Example 10, except that the heat treatment temperature after coating of the titanium dioxide paste was 220° C., to form an electrode for a dye-sensitized solar cell. Upon evaluation of the cohesion, absolutely no peeling was observed, leading to an evaluation of ○.

(Fabrication of Dye-sensitized Solar Cell)

This electrode was used to fabricate a dye-sensitized solar cell in the same manner as Example 10. The I-V characteristic (effective area: 25 mm$^2$) of the obtained dye-sensitized solar cell was evaluated, indicating an open-circuit voltage of 0.70

V, a shorting current density of 8.5 mA/cm$^2$, a fill factor of 0.72 and a photogenerating efficiency of 4.3%.

Examples 14, 15 and Comparative Examples 8, 9

Electrodes were fabricated in the same manner as Example 13, except that the porous semiconductor layer heat temperature in Example 13 was changed as shown in Table 4. Table 4 shows the porous semiconductor layer cohesions and the photogenerating efficiencies of the dye-sensitized solar cells fabricated using the electrodes.

TABLE 4

|  | Example 13 | Example 14 | Example 15 | Comp. Ex. 8 | Comp. Ex. 9 |
| --- | --- | --- | --- | --- | --- |
| Porous semiconductor heat treatment temperature ° C. | 220 | 180 | 240 | 160 | 255 |
| Cohesion evaluation | ○ | ○ | ○ | ○ | x |
| Photogenerating efficiency % | 4.3 | 3.4 | 4.0 | 1.9 | * |

* Notable deformation of electrode, impossible to fabricate a cell.

EFFECT OF THE INVENTION

According to the present invention, it is possible to provide a laminated film for a dye-sensitized solar cell and an electrode for a dye-sensitized solar cell which have excellent adhesion between the transparent conductive layer and the porous semiconductor layer, and allow formation of dye-sensitized solar cells with high photogenerating performance, as well as a process for their production. A solar cell employing the laminated film for a dye-sensitized solar cell and the electrode for a dye-sensitized solar cell can maintain high photogenerating efficiency as a dye-sensitized solar cell even after prolonged exposure to sunlight. The production process of the invention can yield an electrode for a dye-sensitized solar cell which has excellent adhesion between the transparent conductive layer and the porous semiconductor layer.

The invention claimed is:

1. An electrode for a dye-sensitized solar cell electrode comprising a laminated film for a dye-sensitized solar cell and a porous semiconductor layer formed on its transparent conductive layer, wherein the laminated film for a dye-sensitized solar cell is characterized by comprising a polyester film and a transparent conductive layer formed on one side thereof, the transparent conductive layer having a surface tension of 65 mN/m or greater;

wherein the polyester film has a light transmittance of no greater than 2% at a wavelength of 370 nm and a light transmittance of 70% or greater at 400 nm; and wherein the polyester film has an absolute value of no greater than 0.8% for the difference in the heat shrinkage rates in the lengthwise direction and widthwise direction of the film upon heating for 10 minutes at 200° C.

2. An electrode for a dye-sensitized solar cell electrode according to claim 1, wherein the polyester film has a heat shrinkage of 0-0.5% in the lengthwise direction of the film upon heating for 10 minutes at 200° C.

3. An electrode for a dye-sensitized solar cell electrode according to claim 1, which further comprises a readily adhesive layer with a thickness of 10-200 nm between the polyester film and the transparent conductive layer.

4. An electrode for a dye-sensitized solar cell electrode according to claim 3, which further comprises a hard coat layer between the readily adhesive layer and the transparent conductive layer.

5. An electrode for a dye-sensitized solar cell electrode according to claim 1, which further comprises an anti-reflection layer on the side of the laminated film opposite the transparent conductive layer side.

6. An electrode for a dye-sensitized solar cell electrode according to claim 1, wherein the porous semiconductor layer comprises at least one type of metal oxide selected from the group consisting of titanium oxide, zinc oxide and tin oxide.

7. A process for production of an electrode as claimed in claim 1, which electrode is for a dye-sensitized solar cell, characterized by forming a transparent conductive layer on one side of a polyester film having an absolute value of no greater than 0.8% for the difference in the heat shrinkage rates in the lengthwise direction and widthwise direction of the film upon treatment for 10 minutes at 200° C., and baking a metal oxide thereover at 170-250° C. to form a porous semiconductor layer.

8. A process for production of an electrode for a dye-sensitized solar cell according to claim 7, wherein the metal oxide is at least one type of metal oxide selected from the group consisting of titanium oxide, zinc oxide and tin oxide.

* * * * *